United States Patent
Scheller et al.

(10) Patent No.: US 8,089,270 B2
(45) Date of Patent: Jan. 3, 2012

(54) MAGNETIC FIELD DETECTOR HAVING A VARIABLE THRESHOLD

(75) Inventors: P. Karl Scheller, Bow, NH (US); Ravi Vig, Bow, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 491 days.

(21) Appl. No.: 12/401,096

(22) Filed: Mar. 10, 2009

(65) Prior Publication Data

US 2010/0231202 A1    Sep. 16, 2010

(51) Int. Cl.
G01B 7/30     (2006.01)

(52) U.S. Cl. ........... 324/207.2; 324/207.21; 324/207.25; 324/207.12; 324/173

(58) Field of Classification Search .......... 324/173–174, 324/207.2, 207.21, 207.12, 207.25
See application file for complete search history.

(56) References Cited

U.S. PATENT DOCUMENTS

| | | | |
|---|---|---|---|
| 3,697,870 A | | 10/1972 | Brenner |
| 4,405,896 A | | 9/1983 | Akita |
| 4,837,508 A | * | 6/1989 | Garnault ............ 324/166 |
| 5,339,067 A | | 8/1994 | Harris et al. |
| 5,442,283 A | | 8/1995 | Vig et al. |
| 5,446,375 A | * | 8/1995 | Perkins ............ 324/163 |
| 5,497,084 A | | 3/1996 | Bicking |
| 5,650,719 A | | 7/1997 | Moody et al. |
| 5,670,886 A | | 9/1997 | Wolff et al. |
| 5,729,130 A | | 3/1998 | Moody et al. |
| 5,917,320 A | | 6/1999 | Scheller et al. |
| 6,091,239 A | | 7/2000 | Vig et al. |
| 6,100,680 A | | 8/2000 | Vig et al. |
| 6,242,908 B1 | | 6/2001 | Scheller et al. |
| 6,289,072 B1 | | 9/2001 | Hubbard et al. |
| 6,356,741 B1 | | 3/2002 | Bilotti et al. |
| 6,404,188 B1 | | 6/2002 | Ricks |
| 6,525,531 B2 | | 2/2003 | Forrest et al. |
| 6,693,419 B2 | | 2/2004 | Stauth et al. |
| 6,853,178 B2 | | 2/2005 | Hayat-Dawoodi |
| 6,919,720 B2 | | 7/2005 | Vig et al. |
| 7,199,579 B2 | | 4/2007 | Scheller et al. |
| 7,362,094 B2 | | 4/2008 | Voisine et al. |
| 2003/0231013 A1 | * | 12/2003 | Faymon et al. ............ 324/166 |
| 2004/0155649 A1 | * | 8/2004 | Kloos et al. ............ 324/227 |
| 2006/0119348 A1 | | 6/2006 | Blossfeld |

(Continued)

FOREIGN PATENT DOCUMENTS

WO    WO 03/067269 A2    8/2003

OTHER PUBLICATIONS

Notification of Transmittal of the International Search Report and the Written Opinion of the International Searching Authority; PCT/US2010/020602, dated Mar. 26, 2010, 11 pages.

(Continued)

Primary Examiner — Jay Patidar
(74) Attorney, Agent, or Firm — Daly, Crowley, Mofford & Durkee, LLP (57) ABSTRACT

Apparatus for detecting a passing magnetic article includes a peak detector providing a detector output signal that changes state when the magnetic field signal differs from a magnetic field tracking signal by more than a threshold offset amount. The threshold offset amount is dynamically variable in response to detection of a speed of rotation of the magnetic article and a peak-to-peak signal level of the magnetic field signal.

18 Claims, 8 Drawing Sheets

U.S. PATENT DOCUMENTS

2009/0001972 A1    1/2009    Fernandez et al.

OTHER PUBLICATIONS

Notification of Transmittal of the International Search report and the Written Opinion of the International Searching authority; PCT/US2010/020602, dated Mar. 26, 2010, 11 pages.

Datasheet, Allegro Microsystems, Inc., "ATS637LSA, True Power on, Self-Calibrating, Zero Speed Gear Tooth Sensor System," Aug. 2001, 13 pages.

Datasheet, Allegro Microsystems, Inc., "ATS633LSB True Power on, Self-Calibrating, Zero Speed Gear Tooth Sensor System," 2001, 2003, 15 pages.

Response to Office Action dated Jan. 3, 2011 for U.S. Appl. No. 12/425,528; 14 pages.

Final Office Action dated May 5, 2011 for U.S. Appl. No. 12/425,528; 14 pages.

Datasheet, Allegro Microsystems, Inc., "ATS637LSA, True Power on, Self-Calibrating, Zero Speed Gear Tooth Sensor System," Aug. 2001, 13 pages.

Datasheet, Allegro Microsystems, Inc., "ATS633LSB True Power on, Self-Calibrating, Zero Speed Gear Tooth Sensor System," 2001, 2003, 15 pages.

Office Action dated Jan. 3, 2011 from U.S. Appl. No. 12/425,528; 14 pages.

National Semiconductor, ADC0852/ADC0854 Multiplexed Comparator with 8-bit Reference Divider; Apr. 1995; pp. 9-10.

U.S. Response to Final Office Action dated May 5, 2011 for U.S. Appl. No. 12/425,529; 15 pages.

Notification Concerning Transmittal of International Preliminary Report on Patentability (Chapter 1 of the Patent Cooperation Treaty), PCT/US2010/020602, date of mailing Sep. 22, 2011, 2 pages.

Written Opinion of the International Searching Authority, PCT/US2010/020602, date of mailing Sep. 22, 2011, 6 pages.

U.S. Notice of Allowance dated Sep. 14, 2011 and issue fee payment dated Sep. 23, 2011 for U.S. Appl. No. 12/425,529; 14 pages.

Scheller et al., "Circuits and Methods for Providing a Magnetic Field Sensor with an Adaptable Threshold", U.S. Appl. No. 12/425,528, filed Apr. 17, 2009, 43 pages.

\* cited by examiner

MAGNETIC FIELD DETECTOR HAVING A VARIABLE THRESHOLD

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field peak detectors and more particularly to a magnetic field peak detector having a dynamically variable threshold feature.

BACKGROUND OF THE INVENTION

Magnetic field detectors or sensors for detecting magnetic fields associated with a movable magnetic article are known. The magnetic field is detected by one or more a magnetic field transducers, such as a Hall Effect element or a magnetoresistive device, which provides a signal proportional to the detected magnetic field (i.e., a magnetic field signal). The magnetic field signal is compared to a threshold signal to generate an output signal that changes state when the magnetic field signal crosses the threshold signal.

Magnetic field detectors are often used to detect gear features, such as gear teeth and/or gear slots. A magnetic field detector in this application is commonly referred to as a "gear tooth sensor." Gear tooth sensors are used in automotive applications to provide information to an engine control unit for ignition timing control, fuel management, and other operations.

In one type of magnetic field detector, sometimes referred to as a slope-activated or peak-referenced detector, the threshold signal differs from the positive and negative peaks (i.e., the peaks and valleys) of the magnetic field signal by a predetermined "threshold offset amount." Thus, in this type of detector, the output signal changes state when the magnetic field signal comes away from a peak or valley by the predetermined offset amount. In such arrangements, a digital-to-analog circuit (DAC) is used to track the positive and negative peaks of the magnetic field signal to provide a tracking signal.

One way to establish the threshold signal is by using hysteresis associated with the comparator so that the comparator output signal transitions when the magnetic field signal differs from the tracking signal by the comparator hysteresis amount. Thus, in this case, the predetermined threshold offset amount is established by the comparator hysteresis. In another arrangement, the threshold signal is generated by an offset voltage source that provides the threshold signal at a predetermined offset voltage from the tracking signal. Still another way to provide the threshold signal is with the DAC, by having the DAC provide both the tracking signal and the threshold signal at some number of bits difference from the tracking signal.

Detection accuracy can be adversely affected by variations in the magnetic field signal that are attributable to factors other than the passing magnetic article. One source of such magnetic field variations is the spacing (or airgap) between the magnetic article and the magnetic field transducer. Airgap is inversely proportional to the peak-to-peak level of the magnetic field signal, so in small airgap arrangements, the magnetic field signal has a larger peak-to-peak signal level than in larger airgap arrangements.

It can be challenging to choose a threshold signal level that is suitable for both small and large airgap installations. In particular, for larger airgaps, it is desirable for the threshold signal to be closer to the tracking signal (i.e., to use a smaller threshold offset amount) to ensure that the comparator output signal switches as desired; whereas, for smaller airgaps, a threshold signal further from the tracking signal (i.e., a larger threshold offset amount) is desirable in order to prevent output switching due to overshoot on the magnetic field signal.

In certain gear tooth sensors sold by Allegro Microsystems, Inc. of Worcester, Mass. under part numbers ATS631, ATS1637, ATS1633, the threshold offset amount is selected at startup in response to a measurement of the peak magnetic field signal level. If the peak magnetic field signal level is greater than a predetermined amount, then a small airgap is presumed and a relatively large threshold offset amount is used. Alternatively, if the peak magnetic field signal level is less than the predetermined amount, then a large airgap is presumed and a smaller threshold offset amount is used.

SUMMARY OF THE INVENTION

In one aspect, the invention is directed to apparatus for detecting a passing magnetic article and providing a detector output signal indicative of the passing magnetic article including a magnetic field transducer providing a magnetic field signal proportional to the magnetic field and a peak detector responsive to the magnetic field signal for generating a tracking signal that tracks positive and negative peaks of the magnetic field signal and for providing the detector output signal that transitions from a first signal level to a second signal level when the magnetic field signal differs from the tracking signal by more than a threshold offset amount. The apparatus further includes a peak-to-peak signal level detector to detect a peak-to-peak signal level of the magnetic field signal and a speed determination circuit providing a speed signal indicative of a speed of rotation of the magnetic article. A threshold offset determination circuit is responsive to the peak-to-peak signal level of the magnetic field signal and to the speed signal for establishing the threshold offset amount.

In one embodiment, the threshold offset determination circuit provides an enable signal to the peak detector at a first signal level corresponding to a first threshold offset amount when the speed of rotation of the magnetic article is less than a predetermined speed and provides the enable signal at a second level corresponding to a second, smaller threshold offset amount when both the speed of rotation of the magnetic article is greater than the predetermined speed and the peak-to-peak signal level of the magnetic field signal is less than a predetermined level.

In accordance with a further aspect, the invention is directed to a method for establishing a threshold offset amount associated with a peak detector of a magnetic field detector including generating a magnetic field signal proportional to a magnetic field associated with a passing magnetic article, providing a tracking signal that tracks positive and negative peaks of the magnetic field signal and providing a peak detector output signal that transitions from a first signal level to a second signal level when the magnetic field signal differs from the tracking signal by more than a threshold offset amount. The method further includes detecting the peak-to-peak signal level of the magnetic field signal and setting the threshold offset amount in response to a speed of rotation of the passing magnetic article and the peak-to-peak signal level of the magnetic field signal.

In one embodiment, the method includes setting the threshold offset amount to a first threshold offset amount when the speed of rotation of the magnetic article is less than a predetermined speed and setting the threshold offset amount to a second, smaller threshold offset amount when both the speed of rotation of the magnetic article is greater than the predetermined speed and the peak-to-peak signal level of the magnetic field signal is less than a predetermined level.

With this arrangement, the threshold offset amount of the peak detector is advantageously tailored to the peak-to-peak signal level of the magnetic field signal so that in larger airgap installations, where the peak-to-peak magnetic field signal level is smaller, the threshold offset amount is likewise smaller to ensure that the detector output signal switches as appropriate in response to the passing magnetic article; whereas in smaller airgap installations, where the peak-to-peak magnetic field signal is larger, the threshold offset amount is larger to prevent undesirable output signal switching as a result of magnetic field signal overshoot. And unlike conventional arrangements that base the threshold offset amount on the absolute value of the peak magnetic field signal level to prevent switching on magnetic overshoot at close airgap, use of the peak-to-peak magnetic field signal level advantageously permits the use of a differential or single-ended sensor. Additionally, the threshold offset amount is further advantageously tailored to the speed of rotation of the magnetic article so that the threshold offset amount, which initially at power up is set a larger amount, is not allowed to be adjusted to the smaller threshold offset amount until the magnetic article rotates at a predetermined speed. In this way, undesirable output signal switching due to target vibration at power up is avoided. Furthermore, the optimization of the threshold offset amount to rotation speed and magnetic field signal conditions occurs continuously during detector operation, rather than just at startup, and therefore provides the above-described advantages even in response to changing conditions.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 1:
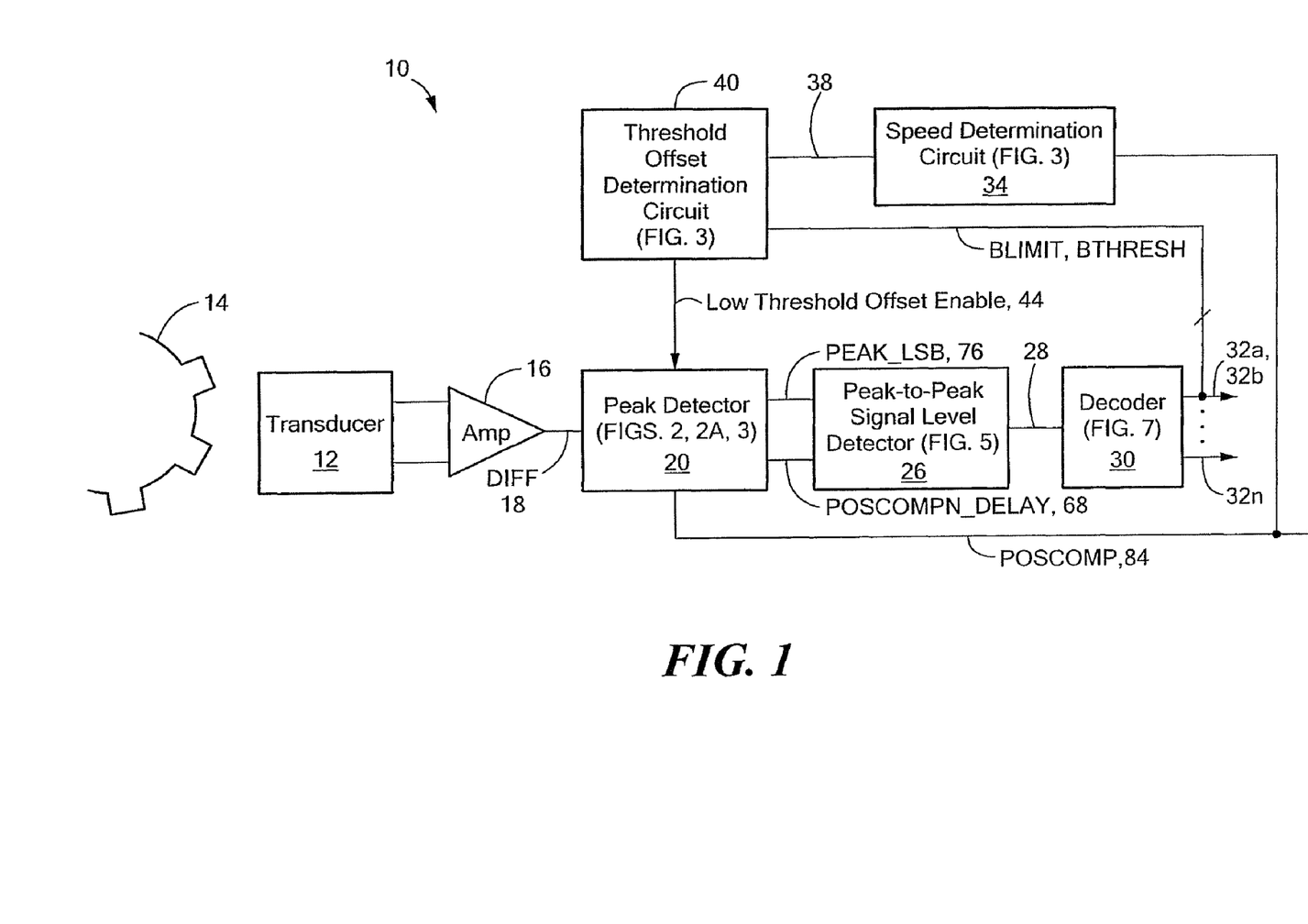
FIG. 1 is a block diagram of a magnetic field detector having a variable threshold according to the invention.

Referring to FIG. 1, a magnetic field detector 10 with a dynamically variable threshold feature includes a magnetic field transducer 12, a peak detector 20, a peak-to-peak signal level detector 26, a speed determination circuit 34, and a threshold offset determination circuit 40. The magnetic field transducer 12 is responsive to a magnetic field associated with a magnetic article 14 and provides a transducer output signal to an amplifier 16 that may implement an automatic gain control (AGC) feature and generates a magnetic field signal, DIFF, 18 that is proportional to the magnetic field. It will be appreciated by those of ordinary skill in the art that the magnetic article 14 may be a hard ferromagnetic material (sometimes referred to as a permanent magnet) or a soft ferromagnetic material, and may be ferrous or non-ferrous. It will also be appreciated that a separate magnetic element may be positioned on the other side of the detector from the magnetic article 14 in a back-bias configuration. In such a back-bias configuration, the magnetic article 14 (i.e., the target) and the separate magnetic element (i.e., the back-biasing element) may both be a hard ferromagnetic material, or the target may be soft ferromagnetic material and the back-biasing element may be hard ferromagnetic material, or the target may be hard ferromagnetic material and the back-biasing element may be soft ferromagnetic material.

The peak-to-peak signal level detector 26 detects the peak-to-peak level of the magnetic field signal 18 and provides a peak-to-peak value signal 28 indicative of the peak-to-peak signal level. The speed determination circuit 24 provides a speed signal 38 indicative of a speed of rotation of the magnetic article 14. The threshold offset determination circuit 40 is responsive to both the peak-to-peak value signal 28 and the speed signal 38 to set a threshold offset amount used by the peak detector 20.

The magnetic field detector 10 also includes a logic circuit, shown as a decoder 30, which receives the peak-to-peak value signal 28 and provides one or more logic signals 32a-32n that indicate if the peak-to-peak magnetic field signal 18 has exceeded one or more predetermined values. In the illustrative embodiment, the logic signals are diagnostic signals indicative of whether or not the detected magnetic field has exceeded a predetermined Gauss level.

In the illustrated circuit 10, the magnetic field transducer 12 is a Hall Effect device. Other types of magnetic field transducers, such as magnetoresistive devices, for example InAs, GMR, TMR, MTJ, or AMR devices, are equally suitable. The transducer 12 may be a single ended or differential arrangement and may include one or more magnetic field transducer elements in various known configurations.

Figure 2:
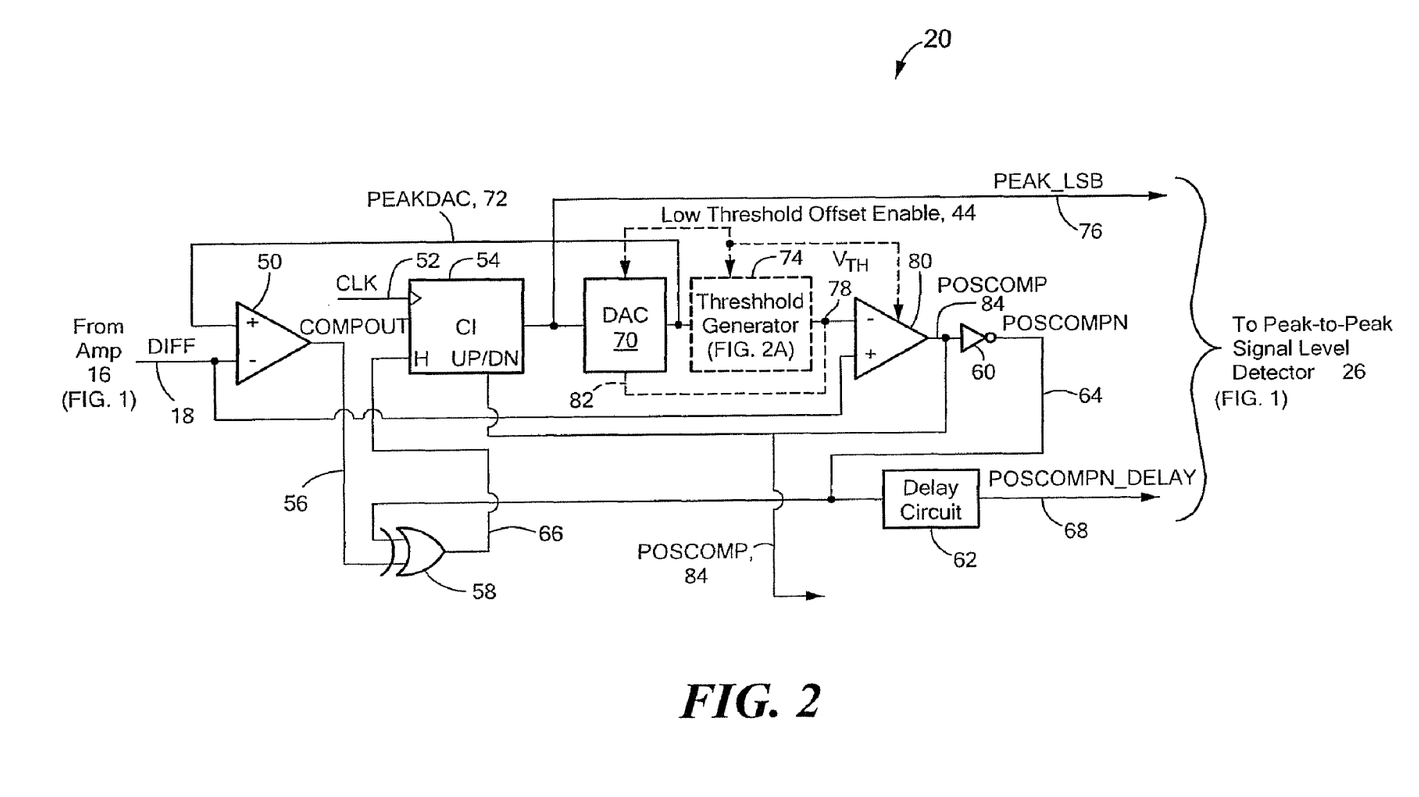
FIG. 2 shows a simplified schematic of the peak detector of FIG. 1.

Referring also to FIG. 2, an illustrative peak detector 20 includes a digital-to-analog converter (DAC) 70 that is responsive to the magnetic field signal 18 and generates a tracking signal, PEAKDAC, 72 that tracks the magnetic field signal and holds the value of the positive and negative peaks until the detector output signal, POSCOMP, 84 transitions. A comparator 80 has a first input responsive to the magnetic field signal 18, a second input responsive to a threshold signal, $V_{TH}$, 78 that is related to the tracking signal 72, and an output at which is provided the POSCOMP output signal 84 that transitions from a first signal level to a second signal level when the magnetic field signal 18 differs from the tracking signal 72 by more than the threshold offset amount.

According to the invention, the magnetic field detector 10 is provided with a dynamically variable threshold feature whereby the threshold offset amount is adjusted during operation in accordance with the peak-to-peak level of the magnetic field signal (which is indicative of airgap) and also in accordance with the speed of rotation of the magnetic article as determined by the speed determination circuit. With this arrangement, problems of inaccurate switching and failing to switch experienced in conventional magnetic field sensors are addressed. In particular, by dynamically adjusting the threshold offset amount to be smaller in larger airgap arrangements, the threshold signal will be closer to the positive and negative peaks of the magnetic field signal, as is desirable to ensure that output signal switching will occur under this condition. Conversely, by dynamically adjusting the threshold offset amount to be larger in smaller airgap installations, the threshold signal will be further from the positive and negative peaks of the magnetic field signal, as is desirable to prevent undesirable output signal switching due to overshoot on the magnetic field signal under this condition. Furthermore, by adjusting the threshold offset amount only after a predetermined minimum speed of rotation of the magnetic article occurs, another problem of conventional magnetic field sensors is addressed; namely, the problem of switching at start up due to target vibration rather than due to actual rotation.

More particularly, the peak detector 20 includes a first comparator 50, an up/down counter ("C1") 54, the DAC 70, and second comparator 80. Also included is an XOR circuit 58, an inverter 60 and a delay circuit 62. The magnetic field signal 18 is coupled to an inverting input of the first comparator 50. The first comparator 50 receives, at the non-inverting input, the tracking signal PEAKDAC 72, as shown. An output signal of the first comparator 50, indicated as COMPOUT 56, is coupled to the XOR gate 58, which additionally receives a POSCOMPN signal 64 (described below) and provides at its output a HOLD input 66 to the counter 54. Counter 54 is further responsive to a clock signal, CLK, 52 and to the POSCOMP signal 84 for controlling whether the counter 54 counts up or down.

The output of the counter 54 is converted into an analog signal by the DAC 70 to provide the PEAKDAC signal 72. As noted above, the comparator 80 has a first input, herein the non-inverting input, responsive to the magnetic field signal 18, a second input, here the inverting input, responsive to a threshold signal $V_{TH}$ 78 that is related to the tracking signal 72, and an output at which is provided the POSCOMP detector output signal 84 that changes state when the magnetic field signal 18 differs from the tracking signal 72 by more than the threshold offset amount.

Various techniques are possible for providing the $V_{TH}$ threshold signal 78 in order to generate the described detector output signal 84. For example, in one embodiment, an optional threshold generator 74 may be coupled between the DAC output and the comparator 80 to generate the threshold signal $V_{TH}$ that is offset from the PEAKDAC signal 72 by the threshold offset amount. One such suitable threshold generator 74 is shown in FIG. 2A.

Figure 2A:
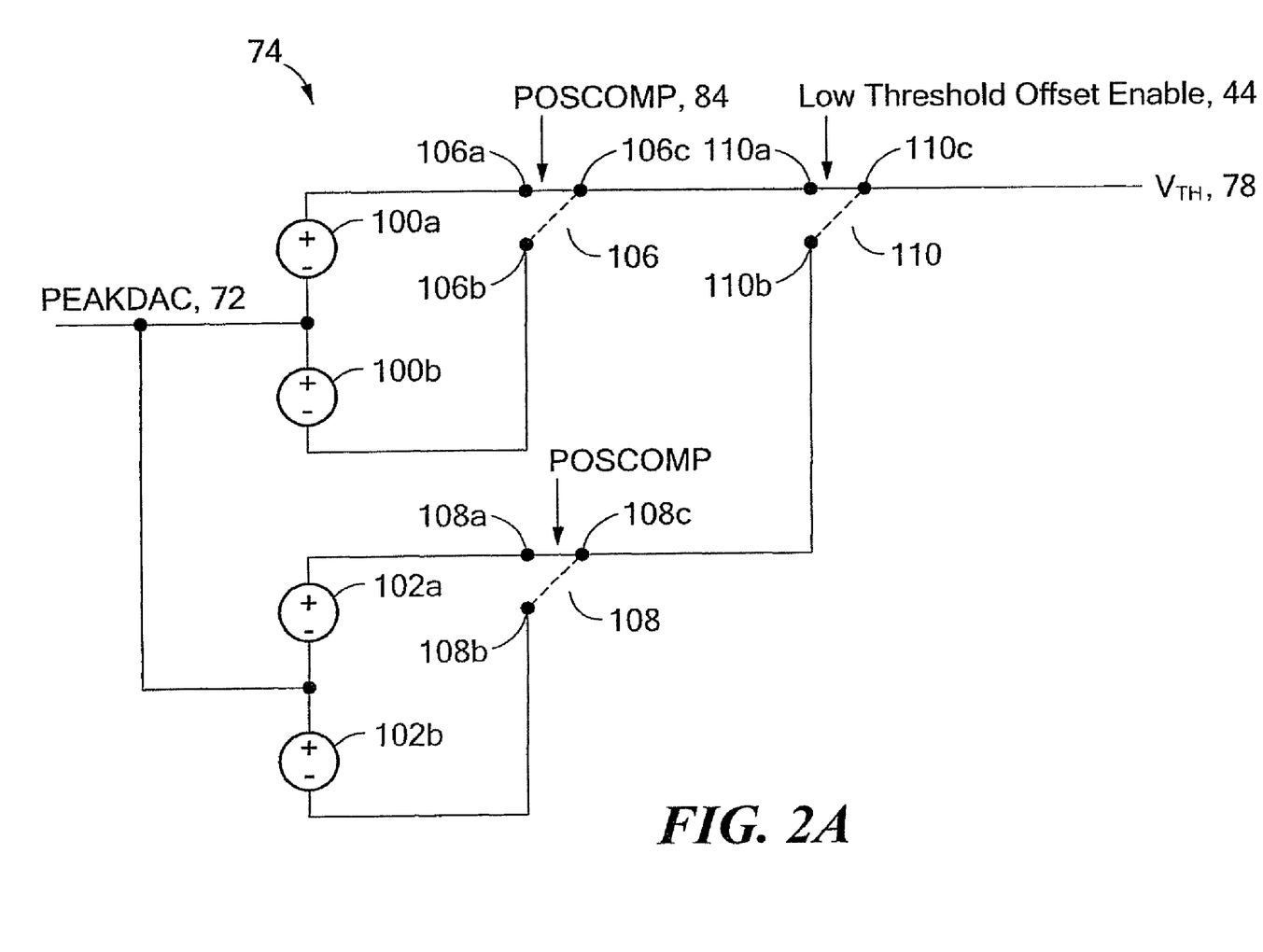
FIG. 2A shows one illustrative threshold generator of FIG. 2.

Referring to FIG. 2A, the threshold generator 74 includes two sets of voltage sources 100a, 100b and 102a, 102b coupled to the PEAKDAC signal 72 and to respective switches 106, 108. A first terminal 106a of switch 106 is coupled to voltage source 100a such that the voltage at switch terminal 106a is greater than the PEAKDAC signal 72 by the voltage of source 100a. A second terminal 106b of switch 106 is coupled to voltage source 100b such that the voltage at switch terminal 106b is less than the PEAKDAC signal 72 by the voltage of source 100b. Similarly, a first terminal 108a of switch 108 is coupled to a voltage source 102a such that the voltage at switch terminal 108a is greater than the PEAKDAC signal 72 by the voltage of source 102a and a second terminal 108b of switch 108 is coupled to voltage source 102b such that the voltage at switch terminal 108b is less than the PEAKDAC signal 72 by the voltage of source 102b. Both switches 106 and 108 are controlled by the POSCOMP signal 84 such that when POSCOMP 84 is at a first level, terminals 106a and 106c are coupled together and terminals 108a and 108c are coupled together; whereas when the POSCOMP signal 84 is at a second level, terminals 106b and 106c are coupled together and terminals 108b and 108c are coupled together.

The voltage sources 100a, 100b provide a lower voltage than voltage sources 102a, 102b. Thus, the voltage at terminal 106a is closer to the PEAKDAC signal level than the voltage at terminal 108a. Likewise, the voltage at terminal 106b is closer to the PEAKDAC signal level than the voltage at terminal 108b.

A further switch 110 is arranged so that a first terminal 110a is coupled to switch terminal 106c and a second terminal 110b is coupled to switch terminal 108c, as shown. A Low Threshold Offset Enable signal 44 provided by the threshold offset determination circuit 40 (FIG. 1) controls switch 110 such that when the Enable signal 44 is at a first level, switch terminals 110a and 110c are coupled together and when the Enable signal is at a second level, switch terminals 110b and 110c are coupled together.

With this arrangement, when the Low Threshold Offset Enable signal 44 is at the first level, the $V_{TH}$ threshold signal 78 differs from the PEAKDAC signal 72 by a first threshold offset amount corresponding to the voltage of sources 102a, 102b and when the Enable signal 44 is at the second level, the $V_{TH}$ threshold signal 78 differs from the PEAKDAC signal 72 by a second, greater threshold offset amount corresponding to the voltage of sources 102a, 102b.

As an alternative arrangement, the threshold signal $V_{TH}$ 78 may be provided by the tracking signal 72 itself and the internal hysteresis of the comparator 80 can be used to achieve switching of the comparator output signal 84 when the magnetic field signal 18 differs from the tracking signal by more than the threshold offset amount, which threshold offset amount is the internal comparator hysteresis. In one such example, the second comparator 80 has a first hysteresis level on the order of 100 mV corresponding to the first threshold offset amount and a second hysteresis on the order of 50 mV, corresponding to the second threshold offset amount with the Low Threshold Offset Enable signal 44 controlling whether the first or the second hysteresis level is used.

As yet another embodiment for generating the detector output signal 84, the DAC 70 may provide the $V_{TH}$ threshold signal as an additional output (shown by dotted line 82) that differs from the PEAKDAC signal 72 by a first predetermined number of bits corresponding to the first threshold offset amount or by a second predetermined number of bits corresponding to the second threshold offset amount, depending on the state of the Low Threshold Offset Enable signal 44. Thus, in this embodiment, the DAC 70 is responsive to the Enable signal 44 for selecting to provide the signal 82 at the first or the second predetermined number of bits from the tracking signal.

It will be appreciated by those of ordinary skill in the art that other techniques are possible for providing the threshold signal $V_{TH}$ 78 related to the value of the PEAKDAC signal 72 such that the comparator output signal transitions when to the magnetic field signal 18 differs from the PEAKDAC signal 72 by more than a first threshold offset amount or by more than a second, greater threshold offset amount, with the selection of the first or second threshold offset amount being controlled by the Low Threshold Offset Enable signal 44.

Figure 3:
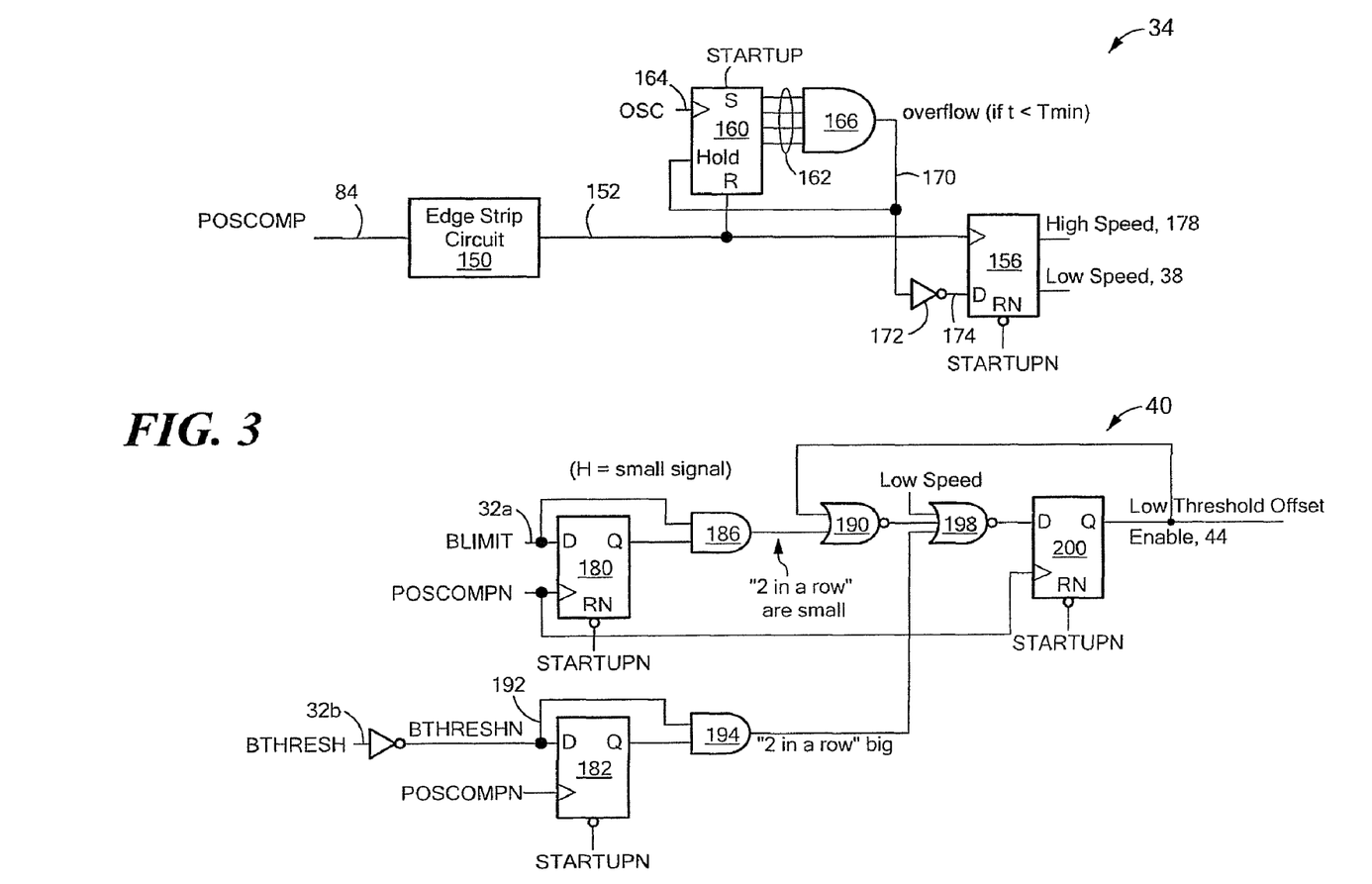
FIG. 3 is a schematic of an illustrative speed determination circuit and threshold offset determination circuit of FIG. 1.
Figure 4:
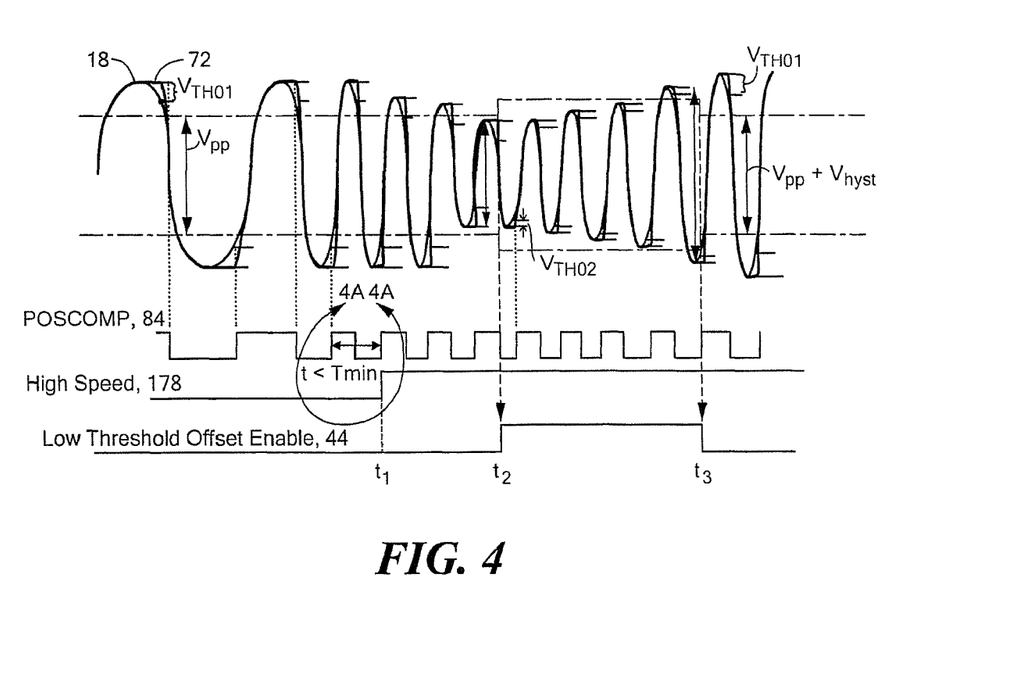
FIG. 4 shows several illustrative waveforms associated of the magnetic field detector of FIG. 1 including the magnetic field signal, the detector output signal and the Low Threshold Offset Enable signal.

Referring also to FIG. 4, illustrative waveforms are shown including the magnetic field signal 18 and the PEAKDAC signal 72. When power is applied to the detector 10, the Low Threshold Offset Enable signal 44 is at a first level here low, causing a first threshold offset amount $V_{THO1}$ to be used by the peak detector 20. The speed of rotation of the article 14 increases until it reaches a predetermined speed at time t1, as indicated by a High Speed signal 178 (FIG. 3) going high. The Enable signal 44 remains at the first level causing the threshold offset amount to remain at the first threshold offset amount $V_{THO1}$ since the peak-to-peak value of the magnetic field signal 18 is greater than a predetermined signal level $V_{PP}$. More particularly, the Enable signal 44 remains at the first level causing the first threshold offset amount $V_{THO1}$ to be used until both the magnetic field signal 18 is less than the predetermined peak-to-peak value $V_{PP}$ and the predetermined speed of rotation is detected. These two conditions first occur together at time t2, as indicated by the Enable signal 44 transitioning to a second level, here high. Once the Enable signal 44 transitions to a high level, the threshold offset amount is changed to the second, lower amount $V_{THO2}$, as shown. The Enable signal 44 remains high until a time t3 when the peak-to-peak magnetic field signal level exceeds a second predetermined signal level $V_{PP}+V_{hyst}$ thereby causing the Enable signal 44 to transition low and the threshold offset amount to be changed back to the first, greater threshold offset amount $V_{THO1}$, as shown.

Referring again to FIG. 2, the peak detector 20 includes an inverter 60 that provides the POSCOMPN signal 64 to the delay circuit 62, which delays the POSCOMPN signal by some predetermined time delay. The delay circuit 62 can take various forms including, but not limited to an RC circuit, an LR circuit, an LRC circuit, and/or a coil such as an inductor. The delayed POSCOMPN signal, shown as POSCOMPN_DELAY signal 68, is provided to the peak-to-peak signal level detector 26. Also provided to the peak-to-peak signal level detector 26 is a PEAK_LSB value signal 76 from the output of the first counter 54. How these two signals POSCOMPN_DELAY and PEAK_LSB are used by the peak-to-peak signal level detector 26 will be discussed below with reference to FIG. 5.

Referring to FIG. 3, illustrative embodiments of the speed determination circuit 34 and the threshold offset determination circuit 40 are shown. The speed determination circuit 34 includes an edge strip circuit 150 that is responsive to the POSCOMP signal 84 and provides a signal 152 having pulses at each transition of the POSCOMP signal 84. The pulse signal 152 provides the clock signal to a flip-flop 156. The edge strip circuit 150 can include an XOR gate and a delay circuit to generate a short pulse in response to each rising and falling edge of the POSCOMP signal 84.

An SR latch 160 is clocked by an oscillator signal, OSC, 164, is set by a STARTUP signal 222 and is reset by the pulse signal 152. The STARTUP signal 222 goes high for approximately 60 µs when power is applied to the detector 10. Outputs 162 of the latch 160 are coupled to an AND gate 166 that provides an overflow output signal 170 to an inverter 172, which inverter 172 provides an input signal 174 to the flip-flop 156, as shown. The flip-flop 156 provides a Low Speed signal 38 to the threshold offset determination circuit 40, which is an inverted version of the High Speed signal 178 shown in FIG. 4.

Figure 4A:
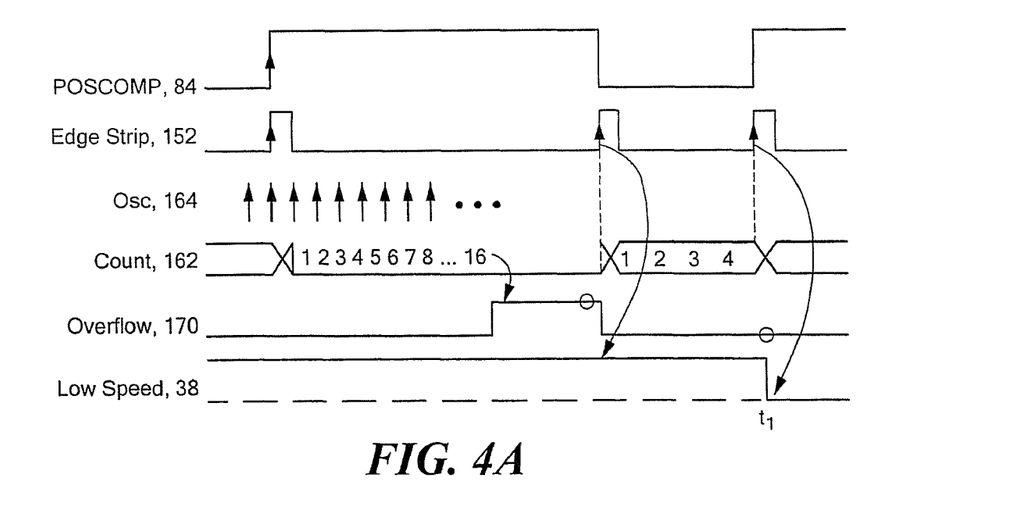
FIG. 4A is an exploded view of a portion of the POSCOMP signal from FIG. 4 along with additional signals associated with the magnetic field detector of FIGS. 1 and 3.

The operation of the speed determination circuit 34 will be apparent from consideration of the illustrative signals of FIG. 4A. Initially, following powerup the magnetic article 14 rotates relatively slowly which causes an overflow pulse 170. The overflow pulse prevents the Low Speed signal 38 at the output flip-flop 156 from changing state. The overflow pulse occurs until POSCOMP signal transitions are close enough together such that the count output 162 of the latch 160 does not reach a predetermined count, thereby indicating that a predetermined speed of rotation has occurred. In one illustrative embodiment, the predetermined speed of rotation is on the order of 3 Khz. Once the magnetic article reaches the predetermined speed of rotation, the overflow signal 170 will remain low and a subsequent transition of the edge stripped signal 152 will cause the Low Speed signal 38 to change state, thereby indicating the occurrence of rotation of the magnetic article of at least the predetermined speed, as occurs at time t1.

The Threshold offset Determination Circuit 40 is responsive to the Low Speed signal 38 and to logic signals 32a-32n from the decoder 30 (FIG. 1). In the illustrative embodiment, a BLIMIT signal 32a and a BTHRESHN signal (which is an inverted version of the BTHRESH signal 32b) are coupled to the D input of respective flip-flops 180, 182. In the illustrative embodiment, the BLIMIT signal 32a indicates whether a predetermined respective airgap has been exceeded corresponding to the magnetic field signal exceeding the first predetermined peak-to-peak signal level $V_{pp}$ and the BTHRESH signal 32b indicates whether a second respective airgap has been exceeded corresponding to the magnetic field signal exceeding the second predetermined peak-to-peak signal level $V_{pp}+V_{hyst}$.

Flip-flops 180, 182 are clocked by the POSCOMPN signal 64 and are reset by the STARTUPN signal which is an inverted version of the STARTUP signal. The BLIMIT signal 32a is also coupled to an AND gate 186, a second input to which is coupled to the Q output of flip-flop 180. The output of AND gate is coupled to an NOR gate 190, a second input to which is coupled to the Q output of flip-flop 200. Similarly, the BTHRESHN signal 192 is also coupled to an AND gate 194, a second input to which is coupled to the Q output of a flip-flop 182. The output of AND gate 194 and the output of NOR gate 190 are coupled to inputs of a further NOR gate 198, which gate is further responsive to the Low Speed signal 38, as shown. The output of the NOR gate 198 provides the D input to a flip-flop 200 that is clocked by the POSCOMPN signal, reset by the STARTUPN signal and that provides the Low Threshold Offset Enable signal 44 at its Q output, as shown.

With this arrangement, the output of NOR gate 190 will be high when two POSCOMP transitions occur during which the magnetic field signal 18 exceeds the BLIMIT airgap (i.e., when the magnetic field signal 18 has a peak-to-peak value of less than 18 Gauss for example). The output of AND gate 194 will be high when two POSCOMP transitions occur during which the magnetic field signal 18 is less than the BTHRESH airgap (i.e, when the magnetic field signal 18 has a peak-to-peak value of greater than 28 Gauss for example). As noted above, the Low speed signal 38 is high when the target 14 is rotating at low speeds of less than a predetermined speed. Thus, the output of the NOR gate 198 will go high to cause the Low Threshold Offset Enable signal 44 to go high (causing the threshold offset amount to be set to the second, lower threshold offset amount) only when the following conditions occur together: (a) two POSCOMP signal transitions occur during which the peak-to-peak level of the magnetic field signal 18 is less than the predetermined level $V_{pp}$ (b) two POSCOMP signal transitions occur during which the peak-to-peak value of the magnetic field signal 18 is less (i.e. not big) than a second, greater predetermined level $V_{pp}+V_{hyst}$ and (c) the Low Speed signal 38 is low indicating that the magnetic article is rotating at at least the predetermined speed. The output of NOR gate 198 goes low to cause the Low threshold Offset Enable signal 44 to go low (causing the threshold offset amount to be set to the first, higher threshold offset amount) when either one of the following conditions occurs: (a) two POSCOMP signal transitions occur during which the peak-to-peak magnetic field signal level is greater than the second predetermined level $V_{pp}+V_{hyst}$; or (b) the Low Speed signal 38 is high indicating that the magnetic article 14 is rotating slower than the predetermined speed.

In one embodiment, the BTHRESH airgap corresponds to a peak-to-peak magnetic field signal level approximately equal to the equivalent peak-to-peak signal level of the BLIMIT airgap plus the first predetermined threshold offset amount $V_{TH01}$. The purpose of requiring the peak-to-peak magnetic field signal level to exceed the second predetermined level $V_{pp}+V_{hyst}$ before transitioning back to the first lower predetermined threshold offset amount is to avoid output signal jitter.

Figure 5:
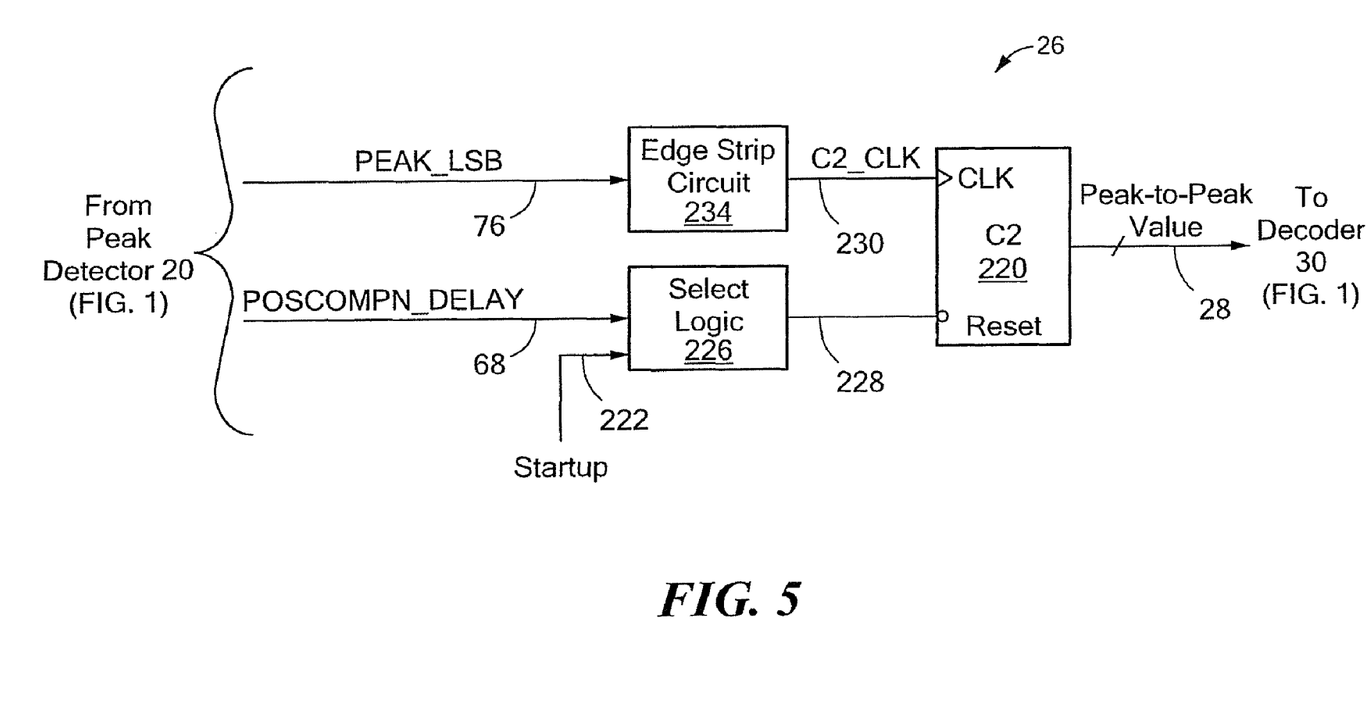
FIG. 5 is a block diagram of an exemplary embodiment of the peak-to-peak signal level detector of FIG. 1.

Now referring to FIG. 5, which shows an exemplary embodiment of the peak-to-peak signal level detector 26, a second counter 220 is reset in response to the STARTUP signal 222 and the POSCOMPN_DELAY signal 68. More particularly, a select logic circuit 226, which can be implemented as a NOR gate, receiving the STARTUP and POSCOMPN_DELAY signals, provides the reset input, indicated by reference numeral 228, to the second counter 220.

The second counter 220 is clocked by a C2_CLK signal 230 which is generated in response to the least significant bit of the output of the first counter 54, that is, the PEAK_LSB signal 76. The second counter 220 provides at its output the peak-to-peak value 28 indicative of the peak-to-peak voltage of the DIFF signal 18. The second counter output signal 28 may be converted into the diagnostic signals 32a-32n by the decoder 30, as will be described in connection with the embodiment of FIG. 7. The output of the second counter 220 may be stored for use or transmitted off of the circuit to an external controller.

The edges of the PEAK_LSB signal 76 are stripped by a circuit ("edge strip circuit") 70 to provide the C2_CLK signal 230 so that every step of the first counter 54 causes a step in the second counter 220. This doubles the resolution of the second counter 220. More particularly, the edge strip circuit 234 can include an XOR gate and delay circuit to generate a short pulse in response to each rising and falling edge of the PEAK_LSB signal 76. In this way, each rising and falling edge of the PEAK_LSB signal 76 generates a clock pulse in the second counter 220.

Figure 6:
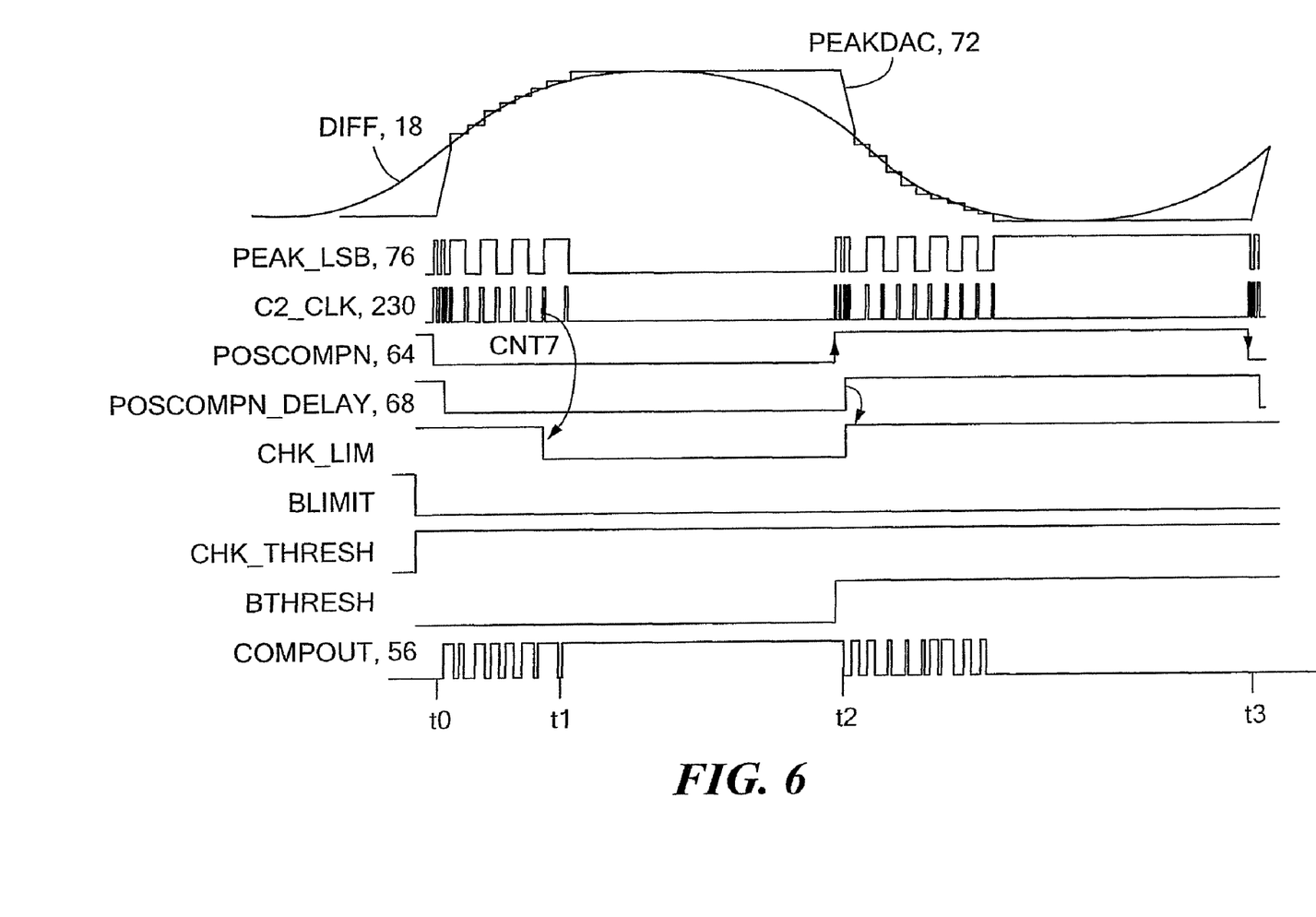
FIG. 6 shows several illustrative signal waveforms associated with the magnetic field detector of FIG. 1.

As is illustrated by the waveforms in FIG. 6, the tracked level of the DIFF signal 18 (i.e., the PEAKDAC output signal 72) acquires the DIFF signal 18 at time t=0. After time t=0, whenever the DIFF signal 18 exceeds the PEAKDAC signal 72 by the hysteresis level of the first comparator 50, such as by 10 mV, the COMPOUT signal 56 at the output of the first comparator 50 transitions to a logic low level, thereby causing the first counter 54 to count. Once the first counter 54 counts up one step, the COMPOUT signal 56 goes high and holds the count value until the DIFF signal 18 exceeds the PEAKDAC signal 72 by 10 mV again. When the DIFF signal 18 reaches a positive peak, the PEAKDAC signal 72 stays above the DIFF signal 18 and keeps the HOLD input signal 66 to the first counter 54 asserted until the hysteresis of the second comparator 80 has been overcome or the threshold signal $V_{TH}$ is crossed, as occurs when the POSCOMPN signal 64 goes high, just before time t2.

Still referring to FIG. 6, between times t0 and t2, the POSCOMPN_DELAY signal 68 is low and the output signal 66 of the select logic circuit (i.e., the NOR gate) 226 is high, thereby enabling the second counter 220 to count by keeping its reset input high. The DAC 70 holds the positive peak of the DIFF signal 18 (which is reached at time t1) until just before time t2, when the DIFF signal 18 varies from the peak value by the threshold offset amount. A logic high transition of the POSCOMPN signal 64 causes the count direction of the first counter 54 to change to the down direction so that the PEAK-DAC signal 72 can track the falling portion of the DIFF signal 18.

Additionally, when the POSCOMPN signal 64 is at a logic high, it causes the POSCOMPN_DELAY signal 68 to go high following the delay interval (of the delay circuit 62), thereby causing the reset input to the second counter 220 to be low and preventing the second counter 220 from being clocked for as long as the POSCOMPN signal 64 remains high. With this arrangement, the second counter 220 is reset during a half cycle of the DIFF signal 18 and the reset input is released during the other half cycle, so that the second counter 220 only counts during a selected one of the rising and falling portions of the DIFF signal 18. In the illustrative embodiment, the second counter 220 counts during the rising portions of the DIFF signal 18. It will be appreciated that, alternatively, the second counter 220 may be controlled to count during falling portions of the DIFF signal 18. As a further alternative, the second counter 220 may be controlled to count during rising and falling portions of the DIFF signal 18 in order to give more frequently updated peak-to-peak signal value (i.e., a peak-to-peak value that is updated twice per DIFF signal cycle).

When the POSCOMPN signal 64 goes high, at a short time before time t2 corresponding to the delay between the POSCOMPN and POSCOMPN_DELAY signals, or the delay interval, the DIFF signal 18 has come away from the held positive peak by the threshold offset amount. At this point, the peak-to-peak value 28 indicative of the peak-to-peak DIFF signal voltage can be measured as a digital word at the output of second counter 220, since that counter counted from time t0 to time t2.

Figure 7:
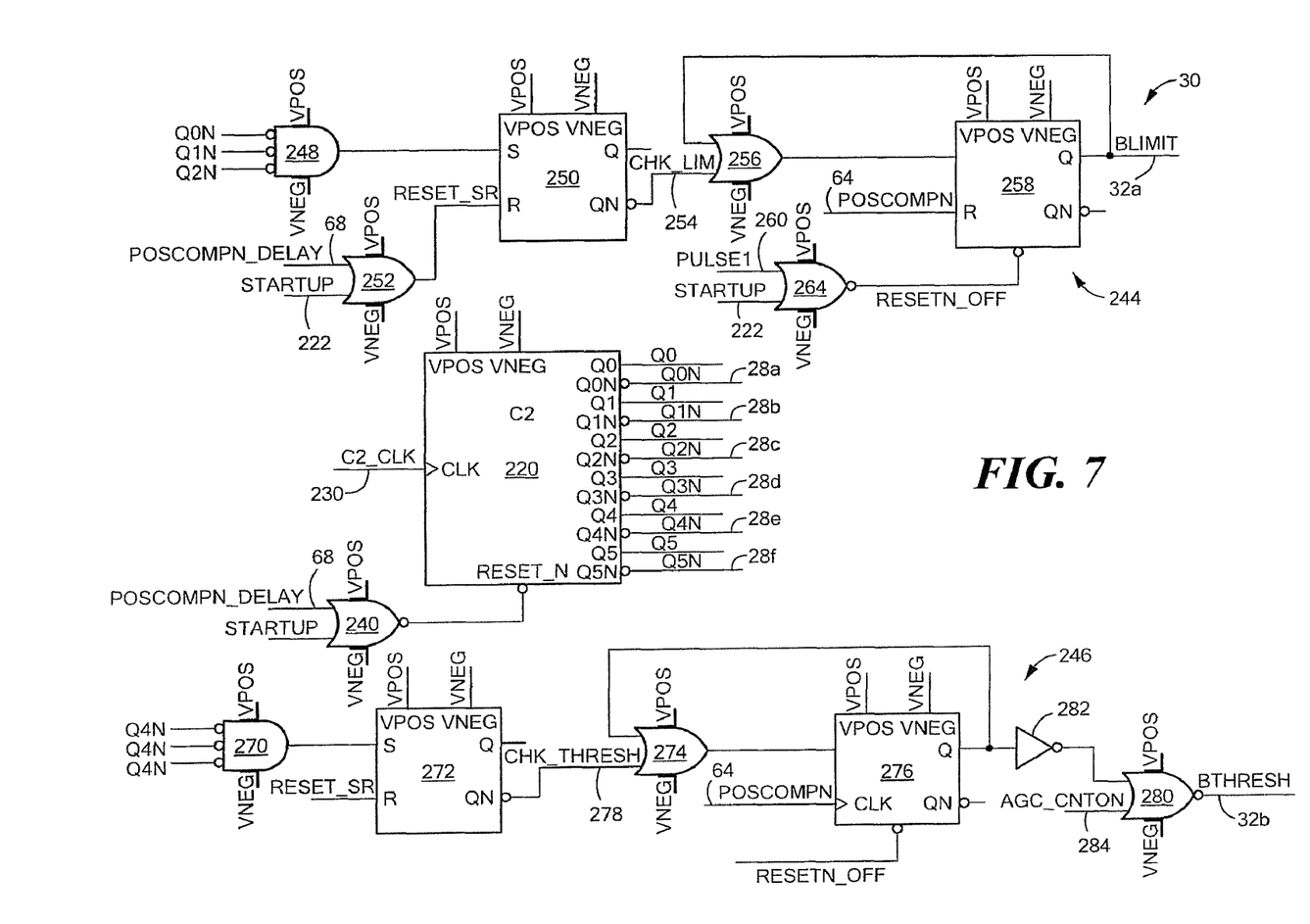
FIG. 7 is a schematic of an illustrative embodiment of the decoder of FIG. 1.

Referring to the detailed schematics of FIG. 7, a portion of the circuit 10 of FIG. 1 is shown to include the second counter 220 of the peak-to-peak signal level detector 26 and the decoder 30. The second counter 220, as discussed earlier with reference to FIG. 5, is reset by a select logic circuit 226 that includes a NOR gate 240, which is responsive to the POSCOMPN_DELAY signal 68 and to the STARTUP signal 222. The second counter 220 provides to the decoder 30 the following output signals: Q0N signal 28a, Q1N signal 28b, Q2N signal 28c, Q3N signal 28d, Q4N signal 28e and Q5N signal 28f. In the illustrative embodiment, the decoder 30 generates the signals 32a, 32b, shown here as diagnostic signals, the BLIMIT signal 32a and the BTHRESH signal 32b, indicative of whether predetermined Gauss levels have been exceeded. The decoder 30 includes two decoder portions, decoder portions 244 and 246.

Considering illustrative decoder portion 244 (FIG. 7), the counter outputs Q0N 28a, Q1N 28b, and Q2N 28c are coupled to an NOR gate 248, as shown. The output of NOR gate 248 is coupled to an RS flip-flop 250, which is reset by the output of an OR gate 252 having as inputs the POSCOMPN_DELAY signal 68 and STARTUP signal 222. With this arrangement, the flip-flop 250 is reset at startup and after each peak of the DIFF signal to be ready for the next cycle. The QN output of flip-flop 250 provides a CHK_LIM signal 254 coupled to an OR gate 256. The output of OR gate 256 is coupled to a flip-flop 258 which generates at its Q output the BLIMIT signal 32a. A logic high BLIMIT signal indicates that a respective airgap, here corresponding to a signal level of 18 Gauss peak-to-peak, has been exceeded (i.e., the BLIMIT signal 32a goes high when the magnetic field strength is less than 18 Gpp). Here, the flip-flop 258 is reset at startup by the STARTUP signal 222 (not labeled) and also by a PULSE1 signal 260 via NOR gate 264.

The other decoder portion 246 is substantially identical to portion 244, containing NOR gate 270 like NOR gate 248, flip-flop 276 and 272 like flip-flop 250, OR gate 274 like OR gate 256, and flip-flop 276 like flip-flop 258. The NOR gate 270 receives counter output Q4N signal 28e. Decoder portion 246 differs from portion 244 in the addition of NOR gate 280, as well as inverter 282, respective, to address circuit operation with automatic gain control (AGC) as discussed below.

In the illustrative embodiment, the POSCOMPN_DELAY signal 68 is delayed by approximately 2 µs in order to keep the CHK_LIM signal 254 intact while the flip-flop 258 is clocked. Thus, the second counter 220 is reset at startup of the circuit 10 and at each positive transition of the POSCOMP-N_DELAY signal 68. As noted above, the second counter 220 is held in reset while the POSCOMPN_DELAY signal 68 is high and is released to permit counting upon each negative transition of the POSCOMPN_DELAY signal 68.

In operation, the BLIMIT and BTHRESH signals initialized to logic state zero at startup and at PULSE1 260, which assumes that the DIFF signal 18 is greater than the BLIMIT threshold and the BTHRESH threshold (i.e., that the respective air gaps are not exceeded). The outputs of flip-flops 250 and 272 (i.e., the CHK_LIM signal 254 and a CHK-_THRESH signal 278) are reset high after every positive peak of the DIFF signal 18, which means that the BLIMIT and BTHRESH signals will remain low unless forced high on any cycle of DIFF. If the second counter 220 counts up to 7, this forces the CHK_LIM signal 254 in the decoder section 244 low and, when the POSCOMPN signal 64 next goes high, it clocks a low state into the flip-flop 258. This causes the BLIMIT signal 32a to stay low, thereby indicating that the DIFF signal 18 is greater than 18 G peak-to-peak. If any peak of the DIFF signal 18 is less than 18 Gpp (meaning that the count value at the output of counter 220 is less than 7), then the CHK_LIM signal 254 does not go low before its value is clocked into flip-flop 258, and BLIMIT signal 32a goes high. Further, the BLIMIT signal 32a will stay high until the PULSE1 260 resets the flip-flop 258. After the flip-flop 258 is clocked by the POSCOMPN signal 64, the CHK_LIM signal 254 at the output of flip-flop 250 is reset high by the POSCOMPN_DELAY signal 68.

Referring to FIGS. 2, 5, and 6, the PEAK_LSB signal 76 stops transitioning starting at time t1 and continuing until the POSCOMPN signal 64 transitions to a high level, since the hold input 66 to the first counter 54 is asserted during that time. As is apparent, once the POSCOMPN signal 64 transitions to either a high or a low level, several fast pulses occur on PEAK_LSB signal 76 and the C2_CLK 230, since the PEAKDAC signal 72 is dropping by the 100 mV of hysteresis almost instantaneously (i.e., as first as the 2 MHz CLK oscillator clock input to first counter 54 allows).

Since the second counter 220 is reset by the POSCOMP-N_DELAY signal 68, and specifically is reset for the interval when the POSCOMPN_DELAY signal 68 is high, these fast C2_CLK pulses occurring when the POSCOMPN signal 64 transitions to a logic low level are not counted by second counter 220 and could represent an inaccuracy in the resulting peak-to-peak signal value as read at the output of the second counter 220 at time t2. Although the second counter 220 counts the fast C2_CLK pulses occurring a short time before time t2, the decoder 30 (FIG. 7) stops looking at the counter's output when it gets clocked on the rising edge of the POSCOMPN signal 64 and therefore, counting these fast pulses does not prevent this possible inaccuracy. In the illustrative embodiment, this possible inaccuracy is prevented in the decoder 30 by subtracting the 100 mV of hysteresis from the peak-to-peak DIFF signal 18 when computing the corresponding count value of the second counter 220.

An alternative way to correct for this inaccuracy is to modify the POSCOMPN_DELAY signal 68 so that it is delayed with respect to the POSCOMPN signal 64 only on rising edges. With this arrangement, the counter 220 would be reset at the same time that the POSCOMPN signal 64 goes low, thereby permitting these fast C2_CLK pulses just before time t0 to be counted by the second counter 220 before the flip-flop 258 is clocked when the POSCOMPN signal 64 goes high. Therefore a true representation of the peak-to-peak value will exist at the output of second counter 220 when the QN output of latch 250 is clocked into flip-flop 258.

The digital word 28 at the output of the second counter 220 represents the number of C2_CLK edges that have clocked the second counter 220. The peak-to-peak DIFF voltage can be determined by simply multiplying the second counter 220 output value 28 by the step size in volts associated with each count of the second counter 220. For example, if the second counter 220 output value is thirteen and each step of the second counter 220 corresponds to an 18 mV step in the DAC voltage, then the DIFF signal is 234 mV peak-to-peak. Further, in the magnetic field application of the illustrated embodiment, the peak-to-peak DIFF signal voltage can be converted to Gauss by dividing the value of the peak-to-peak DIFF signal voltage by the amplifier gain in mV/Gauss. For example, if the gain is 14 mV/Gauss then, in the above example, the DIFF signal voltage of 234 mVpp is generated by a magnetic field of (234 mVpp)/(14 mV/G) or 16.7 Gpp, assuming that the possible inaccuracy described above is prevented.

In the illustrative embodiment, BLIMIT signal 32a is high when the magnetic field signal exceeds 18 Gpp and the BTHRESH signal 32b is high when the magnetic field signal exceeds 28 Gpp. Given a gain of 14 mV/G and a step value associated with each count in the second counter 220 of 18 mV/step, the BLIMIT threshold of 18 Gpp is exceeded by a DIFF signal value of (18 Gpp)(14 mV/G)=252 mVpp and this DIFF signal value corresponds to an output value of counter 220 of (252 mV−100 mV)/(18 mV/step)=8.4 or rounding, a count of 8. Note that the 100 mV subtracted from the peak-to-peak DIFF signal value is the hysteresis of second comparator 80 (FIG. 2) since the C2_CLK pulses are not counted during the delay interval occurring just prior to time t0. As will be appreciated, if the POSCOMPN_DELAY signal 68 were modified as described above, to be delayed with respect to the POSCOMPN signal 64 on rising edges only, then the 100 mV hysteresis need not be subtracted from the DIFF signal value when computing the corresponding count values as above.

The Hall effect sensor 10 of the illustrated embodiment implements AGC in the amplifier 16 (FIG. 1), whereby the gain in mV/G can change. This feature can impact operation of the peak-to-peak signal level detector 26 since a particular output 28 of the second counter 220 which corresponded to one predetermined Gauss level prior to the AGC being activated, will correspond to a different Gauss level after the AGC is activated.

This potential problem is handled relatively simply in the illustrative embodiment due to the particular AGC scheme implemented. According to the AGC operation, the amplifier 16 is at a maximum gain until the ambient magnetic field reaches a level of 60 Gpp and is then at a reduced gain for signal levels greater than 60 Gpp. The BTHRESH signal 32*b* is forced low when AGC is activated since the BTHRESH signal 32*b* should be low when the peak-to-peak signal is at 60 Gauss and AGC operation could cause the BTHRESH signal 32*b* to be high incorrectly. The BLIMIT signal 32*a* is not forced low in this manner since at 61 Gpp the DIFF signal will be so high in millivolts, even when AGC is activated, that the BLIMIT signal 32*a* will not be caused to go high incorrectly.

This operation of forcing the BTHRESH signal low is achieved by the NOR gate 280 of decoder portion 246. Input AGC_CNT0N signal 284 is high when AGC is activated (i.e., when the gain is no longer at maximum). Thus, whenever AGC is activated and the AGC_CNT0N signal 284 is high, the BTHRESH signal 32*b* is forced low.

Thus, the decoder 30 deals with AGC gain changes by forcing the BTHRESH signal low when AGC is activated. This solution is acceptable for AGC gain changes in the case described above—that is, the case where AGC is triggered only when the peak-to-peak value is greater than the BTHRESH threshold. In this particular case, it is known that the Gauss levels associated with BLIMIT and BTHRESH have been exceeded when AGC is triggered. Also, the circuit 10 starts in maximum gain and any AGC events result in a decrease in the gain of the circuit 10.

All references cited herein are hereby incorporated herein by reference in their entirety.

Having described preferred embodiments of the invention, it will now become apparent to one of ordinary skill in the art that other embodiments incorporating their concepts may be used.

It is felt therefore that these embodiments should not be limited to disclosed embodiments, but rather should be limited only by the spirit and scope of the appended claims.

What is claimed is:

1. Apparatus for detecting a passing magnetic article and providing a detector output signal indicative of the passing magnetic article comprising:
   a magnetic field transducer responsive to a magnetic field associated with the magnetic article for generating a magnetic field signal proportional to the magnetic field;
   a peak detector responsive to the magnetic field signal for generating a tracking signal that tracks positive and negative peaks of the magnetic field signal and for providing the detector output signal that transitions from a first signal level to a second signal level when the magnetic field signal differs from the tracking signal by more than a threshold offset amount;
   a peak-to-peak signal level detector responsive to the magnetic field signal for detecting a peak-to-peak signal level of the magnetic field signal;
   a speed determination circuit for providing a speed signal indicative of a speed of rotation of the magnetic article; and
   a threshold offset determination circuit responsive to the peak-to-peak signal level of the magnetic field signal and to the speed signal for establishing the threshold offset amount.

2. The apparatus of claim 1 wherein the magnetic field transducer comprises a Hall effect device.

3. The apparatus of claim 2 wherein the peak detector comprises a digital-to-analog converter responsive to the magnetic field signal for generating the tracking signal and a comparator having a first input responsive to the magnetic field signal, a second input responsive to a threshold signal related to the tracking signal, and an output at which the detector output signal is provided.

4. The apparatus of claim 3 wherein the threshold offset determination circuit provides an enable signal to the peak detector at a first level corresponding to a first threshold offset amount when the speed of rotation of the magnetic article is less than a predetermined speed and provides the enable signal to the peak detector at a second level corresponding to a second, smaller threshold offset amount when both the speed of rotation of the magnetic article is greater than the predetermined speed and the peak-to-peak signal level of the magnetic field signal is less than a predetermined level.

5. The apparatus of claim 4 further comprising a threshold generator responsive to the tracking signal for generating the threshold signal at a first threshold signal level that differs from the tracking signal by the first threshold offset amount when the enable signal is at the first level and for generating the threshold signal at a second threshold signal level that differs from the tracking signal by the second threshold offset amount when the enable signal is at the second level.

6. The apparatus of claim 4 wherein the threshold signal is substantially equal to the tracking signal and the comparator has a first hysteresis level corresponding to the first threshold offset amount when the enable signal is at the first level and a second hysteresis level corresponding to the second threshold offset amount when the enable signal is at the second level.

7. The apparatus of claim 4 wherein the digital-to-analog converter provides the threshold signal at a first threshold signal level that differs from the tracking signal by the first threshold offset amount when the enable signal is at the first level and at a second threshold signal level that differs from the tracking signal by the second threshold offset amount when the enable signal is at the second level.

8. The apparatus of claim 4 further comprising a decoder responsive to the peak-to-peak signal level of the magnetic field signal for providing a logic signal having a state indicative of whether the peak-to-peak signal level of the magnetic field signal is greater than the predetermined level, wherein the logic signal is coupled to the threshold offset determination circuit.

9. The apparatus of claim 1 wherein the magnetic field transducer comprises a magnetoresistive device.

10. The apparatus of claim 9 wherein the peak detector comprises a digital-to-analog converter responsive to the magnetic field signal for generating the tracking signal and a comparator having a first input responsive to the magnetic field signal, a second input responsive to a threshold signal related to the tracking signal, and an output at which the detector output signal is provided.

11. The apparatus of claim 10 wherein the threshold offset determination circuit provides an enable signal to the peak detector at a first level corresponding to a first threshold offset amount when the speed of rotation of the magnetic article is less than a predetermined speed and provides the enable signal to the peak detector at a second level corresponding to a second, smaller threshold offset amount when both the speed of rotation of the magnetic article is greater than the predetermined speed and the peak-to-peak signal level of the magnetic field signal is less than a predetermined level.

12. The apparatus of claim 11 further comprising a threshold generator responsive to the tracking signal for generating the threshold signal at a first threshold signal level that differs from the tracking signal by the first threshold offset amount when the enable signal is at the first level and for generating the threshold signal at a second threshold signal level that differs from the tracking signal by the second threshold offset amount when the enable signal is at the second level.

13. The apparatus of claim 11 wherein the threshold signal is substantially equal to the tracking signal and the comparator has a first hysteresis level corresponding to the first threshold offset amount when the enable signal is at the first level and a second hysteresis level corresponding to the second threshold offset amount when the enable signal is at the second level.

14. The apparatus of claim 11 wherein the digital-to-analog converter provides the threshold signal at a first threshold signal level that differs from the tracking signal by the first threshold offset amount when the enable signal is at the first level and at a second threshold signal level that differs from the tracking signal by the second threshold offset amount when the enable signal is at the second level.

15. The apparatus of claim 11 further comprising a decoder responsive to the peak-to-peak signal level of the magnetic field signal for providing a logic signal having a state indicative of whether the peak-to-peak signal level of the magnetic field signal is greater than the predetermined level, wherein the logic signal is coupled to the threshold offset determination circuit.

16. A method for establishing a threshold offset amount associated with a peak detector of a magnetic field detector comprising:
   generating a magnetic field signal proportional to a magnetic field associated with a passing magnetic article;
   providing a tracking signal that tracks positive and negative peaks of the magnetic field signal;
   providing a peak detector output signal that transitions from a first signal level to a second signal level when the magnetic field signal differs from the tracking signal by more than a threshold offset amount;
   detecting the peak-to-peak signal level of the magnetic field signal; and
   setting the threshold offset amount in response to a speed of rotation of the passing magnetic article and the peak-to-peak signal level of the magnetic field signal.

17. The method of claim 16 wherein setting the threshold offset amount comprises setting the threshold offset amount to a first threshold offset amount when the speed of rotation of the magnetic article is less than a predetermined speed and setting the threshold offset amount to a second, smaller threshold offset amount when both the speed of rotation of the magnetic article is greater than the predetermined speed and the peak-to-peak signal level of the magnetic field signal is less than a predetermined level.

18. The method of claim 16 wherein providing the peak detector output signal comprises comparing the magnetic field signal to a threshold signal and providing the result of the comparison as the peak detector output signal.

* * * * *

UNITED STATES PATENT AND TRADEMARK OFFICE
CERTIFICATE OF CORRECTION

| | | |
|---|---|---|
| PATENT NO. | : 8,089,270 B2 | |
| APPLICATION NO. | : 12/401096 | |
| DATED | : January 3, 2012 | |
| INVENTOR(S) | : P. Karl Scheller et al. | |

It is certified that error appears in the above-identified patent and that said Letters Patent is hereby corrected as shown below:

Column 1, line 24 delete "more a magnetic" and replace with --more magnetic--.

Column 6, line 66 delete "when to the" and replace with --when the--.

Column 11, line 14 delete "flip-flop 276 and 272" and replace with --flip-flop 272--.

Column 11, line 61 delete "first" and replace with --fast--.

Signed and Sealed this
Tenth Day of July, 2012

David J. Kappos
*Director of the United States Patent and Trademark Office*